United States Patent
Baker et al.

(10) Patent No.: US 7,176,737 B2
(45) Date of Patent: Feb. 13, 2007

(54) PHASE-LOCKED LOOP AND DELAY-LOCKED LOOP INCLUDING DIFFERENTIAL DELAY CELLS HAVING DIFFERENTIAL CONTROL INPUTS

(75) Inventors: Michael P. Baker, Round Rock, TX (US); Steven C. Meyers, Round Rock, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/876,730

(22) Filed: Jun. 25, 2004

(65) Prior Publication Data
US 2004/0263227 A1 Dec. 30, 2004

Related U.S. Application Data

(60) Provisional application No. 60/483,208, filed on Jun. 27, 2003.

(51) Int. Cl.
*H03H 11/26* (2006.01)
(52) U.S. Cl. .......... 327/280; 327/158; 327/266; 327/274; 327/287; 331/57
(58) Field of Classification Search ............ 331/55; 327/158, 266, 274, 280, 287
See application file for complete search history.

(56) References Cited

U.S. PATENT DOCUMENTS

| | | | |
|---|---|---|---|
| 4,939,518 A * | 7/1990 | Hotta et al. ............... | 341/159 |
| 5,172,076 A | 12/1992 | Brown ..................... | 331/57 |
| 5,396,131 A * | 3/1995 | Miki et al. ................ | 327/65 |
| 5,440,515 A * | 8/1995 | Chang et al. ............. | 365/194 |
| 5,489,878 A | 2/1996 | Gilbert .................... | 331/57 |
| 5,789,989 A | 8/1998 | Paschal et al. ........... | 331/57 |
| 5,867,778 A | 2/1999 | Khoury et al. ........... | 455/321 |
| 5,994,939 A * | 11/1999 | Johnson et al. .......... | 327/280 |
| 6,900,703 B2 * | 5/2005 | Garvin .................... | 331/183 |
| 2003/0201815 A1 * | 10/2003 | Tung et al. .............. | 327/359 |

OTHER PUBLICATIONS

International Search Report, PCT/US2004/021035, mailed Nov. 3, 2004.
Park et al., "A Low-Noise, 900-MHz VCO in 0.6-μm CMOS," IEEE Journal of Solid-State Circuits, vol. 34, No. 5, May 1999, pp. 586-591.
Maneatis, "Low-Jitter Process-Independent DLL and PLL Based on Self-Biased Techniques," IEEE Journal of Solid-State Circuits, vol. 31, No. 11, Nov. 1996, pp. 1723-1732.

\* cited by examiner

*Primary Examiner*—Quan Tra
*Assistant Examiner*—Khareem E Almo
(74) *Attorney, Agent, or Firm*—Kevin L. Daffer; Daffer McDaniel, LLP

(57) ABSTRACT

A differential delay cell is provided herein that not only receives a pair of differential input values, but also receives a pair of differential control values for delaying the differential input values to produce a pair of differential output values. As such, a delay cell is provided, which is truly differential, and therefore, capable of demonstrating a significant improvement in noise performance. The differential delay cell of the present invention also demonstrates high frequency stability around the center frequency, constant gain and increased tuning range capabilities. In this manner, the differential delay cell may be used in PLL or DLL designs as part of a low noise VCO or a low noise delay line, respectively.

16 Claims, 8 Drawing Sheets

PHASE-LOCKED LOOP AND DELAY-LOCKED LOOP INCLUDING DIFFERENTIAL DELAY CELLS HAVING DIFFERENTIAL CONTROL INPUTS

PRIORITY CLAIM

This application claims benefit of priority to a provisional patent application, Ser. No. 60/483,208, entitled "Phased-lock Loop and Delay-locked Loop Including Differential Delay Cells Having Differential Control Inputs," filed Jun. 27, 2003, which is hereby incorporated in its entirety.

BACKGROUND OF THE INVENTION

1. Field of the Invention

This invention relates to delay cells and, more particularly, to a differential delay cell with differential control inputs for use in Voltage Controlled Oscillators ("VCO") and delay lines. The differential delay cell can be implemented using CMOS or BiCMOS technologies.

2. Description of the Related Art

The following descriptions and examples are given as background only.

Phase-locked loops ("PLL's") and delay-locked loops ("DLL's") are routinely used for data and telecommunications, frequency synthesis, clock recovery, and similar applications. In some cases, for example, PLL's and DLL's may be used in the I/O interfaces of digital integrated circuits to hide clock distribution delays and to improve overall system timing. In general, a PLL or DLL may be used to generate one or more clocking signals that are in phase alignment with a reference clock. More specifically, a PLL is a closed-loop device that uses a voltage-controlled oscillator (VCO) to obtain accurate phase alignment between the generated clocking signals and the reference signal. A DLL device, on the other hand, generally differs from a PLL device in that it uses a delay line, instead of a VCO, to obtain accurate phase alignment between the clocking and reference signals.

Unfortunately, the rising demand for high-speed electronics has created an increasingly noisy environment in which PLL's and DLL's must function. This noise, typically in the form of power supply and substrate noise, may cause the output clocks (i.e., the clocking signals) of a PLL or DLL to jitter from their ideal timing. Jitter often leads to decreased stability around the operating frequency (otherwise referred to as the "center frequency"). With a shrinking tolerance for jitter in the decreasing period of the output clock, the design of low jitter PLL's and DLL's has become very challenging.

Achieving low jitter in PLL and DLL designs can be difficult due to a number of design tradeoffs. Consider, for example, a typical PLL based on a voltage-controlled oscillator. The amount of jitter produced as a result of power supply and substrate noise is directly related to how quickly the PLL can correct the output frequency. To reduce jitter, the loop bandwidth (i.e., the range of possible frequencies within the PLL) should be set as high as possible. Unfortunately, the loop bandwidth is generally affected by many process technology factors, and thus, is often constrained well below the lowest operating frequency for stability. In some cases, these constraints can cause the PLL to have a narrow operating frequency range (since the loop bandwidth is directly dependent on the VCO gain) and poor noise performance.

VCO's are often fabricated using GaAs or bipolar technology to obtain high operation frequencies and better noise performance. Due to the increasing demand for lower cost and higher integration, however, VCO's have recently been fabricated using CMOS technology to obtain operating frequencies of several Gigahertz. Still, phase-noise reduction remains a challenge for typical CMOS voltage controlled oscillators.

CMOS LC-tank oscillators with an on-chip spiral inductor have been studied to improve phase-noise performance. Although CMOS LC-tank oscillators show some possibilities for better noise performance, CMOS LC-tank oscillators must overcome several barriers before becoming a reliable VCO. In particular, the implementation of a high-quality inductor in a standard CMOS process is often limited by parasitic effects and usually requires extra non-standard processing steps. Moreover, the integrated LC-tank oscillator generally demonstrates a narrow tuning range, thereby making the performance of the PLL sensitive to process variations.

A ring oscillator, on the other hand, can be smoothly integrated into a standard CMOS process without requiring extra processing steps (since it does not require passive resonant elements). In addition, a wide operating range may be easily obtained when the ring oscillator is employed as a VCO. However, the ring oscillator is not without limitations and usually demonstrates poorer phase-noise performance than the LC-tank oscillator. In some cases, differential delay cells have been employed within ring oscillators in an attempt to reduce phase-noise. These delay cells, however, cannot achieve maximum noise rejection since they are not truly differential.

SUMMARY OF THE INVENTION

The problems outlined above may be in large part addressed by an improved differential delay cell, and in particular, a differential delay cell that not only receives a pair of differential input values, but also receives a pair of differential control values for delaying the differential input values and producing a pair of differential output values.

In one embodiment, the differential delay cell may be a three-stage delay cell including a primary stage, a secondary stage and a feedback stage. In general, the feedback stage may include a pair of differential control transistors and a first constant current source. The secondary stage may include a first pair of differential input transistors having source terminals coupled in parallel to the feedback stage, and more specifically, coupled to the first constant current source through one of the pair of differential control transistors in the feedback stage. In addition, the secondary stage may include a pair of cross-coupled transistors having source terminals coupled in parallel to the first constant current source through another one of the pair of differential control transistors in the feedback stage.

In a particular embodiment, each of the differential control transistors may be coupled for receiving one of the pair of differential control values. For example, one of the differential control transistors may be coupled to the first pair of differential input transistors for conducting a first control current, while the other of the differential control transistors is coupled to the pair of cross-coupled transistors for conducting a second control current. Thus, the differential control transistors may be configured for ensuring that, as one of the control currents increases, the other of the control currents decreases by a substantially identical amount. In this manner, the differential control transistors may enable the differential delay cell to provide a substantially constant gain and a substantially linear frequency versus control current response over an operational range of the differential delay cell.

The secondary stage of the differential delay cell may further include a pair of resistive loads and an adjustable load. The resistive loads may be fixed or active loads, and each may be coupled between a power supply node and a drain terminal of a different one of the second pair of input transistors. The adjustable load may be coupled between the drain terminals of the second pair of input transistors. In this manner, the adjustable load may be adapted to extend a range by which an output signal produced by the differential delay cell can be delayed relative to an input signal applied to the differential delay cell.

The primary stage of the differential delay cell may include a second pair of differential input transistors and a second constant current source. In general, the drain and source terminals of the second pair of differential input transistors may be coupled in parallel to the first pair of differential input transistors and the second constant current source, respectively. In this manner, the second constant current source may be adapted to prevent the differential delay cell from latching when a control current associated with the first constant current source becomes greater than approximately 50% of a total current within the differential delay cell.

In another embodiment, a phase-locked loop device may include a phase comparator, a loop filter responsive to the phase comparator and a voltage-controlled oscillator responsive to the loop filter. In some cases, the voltage controlled oscillator may include one or more differential delay cells, where each of the differential delay cells comprises a first pair of differential input transistors having source terminals coupled in parallel to a first constant current source through one of a pair of differential control transistors. Each of the differential delay cells may also include a pair of cross-coupled transistors having source terminals coupled in parallel to the first constant current source through another one of the pair of differential control transistors.

In general, the pair of differential control transistors may be coupled for receiving differential control values, which enable a first control current flowing through one of the differential control transistors to increase, while a second control current flowing through the other of the differential control transistors is decreased by a substantially identical amount. The differential control values may, therefore, enable the differential delay cell to provide a substantially constant gain and a substantially linear frequency versus control current response over an operational range of the differential delay cell. In some cases, the differential control values may be supplied by a differential charge pump included within the phase comparator. In other cases, however, the differential control values may be supplied by a differential driver included within the voltage controlled oscillator.

In some cases, the differential delay cell may further include a second pair of differential input transistors coupled in parallel to the first pair of differential input transistors and to a second constant current source. In such cases, the second constant current source may be adapted to prevent the differential delay cell from stopping oscillations in the voltage controlled oscillator when a control current associated with the first constant current source becomes greater than approximately 50% of a total current within the differential delay cell.

In yet another embodiment, a delay-locked loop device may include a phase comparator, a loop filter responsive to the phase comparator and a delay line responsive to the loop filter. In some cases, the delay line may include one or more differential delay cells. As such, each of the differential delay cells may include a first pair of transistors for receiving differential input signals and a second pair of transistors for receiving differential control signals. As such, the differential delay cell may be configured to generate differential output signals for delaying the differential input signals by an amount determined by the differential control signals.

In general, the second pair of transistors may be differential control transistors, which enable a first control current flowing through one of the differential control transistors to increase, while a second control current flowing through the other of the differential control transistors is decreased by a substantially identical amount. The differential control signals may, therefore, enable the differential delay cell to provide a substantially constant gain and a substantially linear frequency versus control current response over an operational range of the differential delay cell. The differential control signals may be supplied by a differential charge pump included within the phase comparator, or by a differential driver included within the delay line.

In some cases, the differential delay cell may include a pair of resistive load elements and an adjustable load element. The resistive load elements may be fixed or active elements, whereas the adjustable load element may be a variable capacitance element (i.e., a varactor). In any case, the adjustable load element may be coupled between the pair of resistive load elements for delaying the differential output signals by an additional amount over an amount determined by the pair of resistive load elements and differential control signals.

BRIEF DESCRIPTION OF THE DRAWINGS

Other objects and advantages of the invention will become apparent upon reading the following detailed description and upon reference to the accompanying drawings in which.

Figure 1:
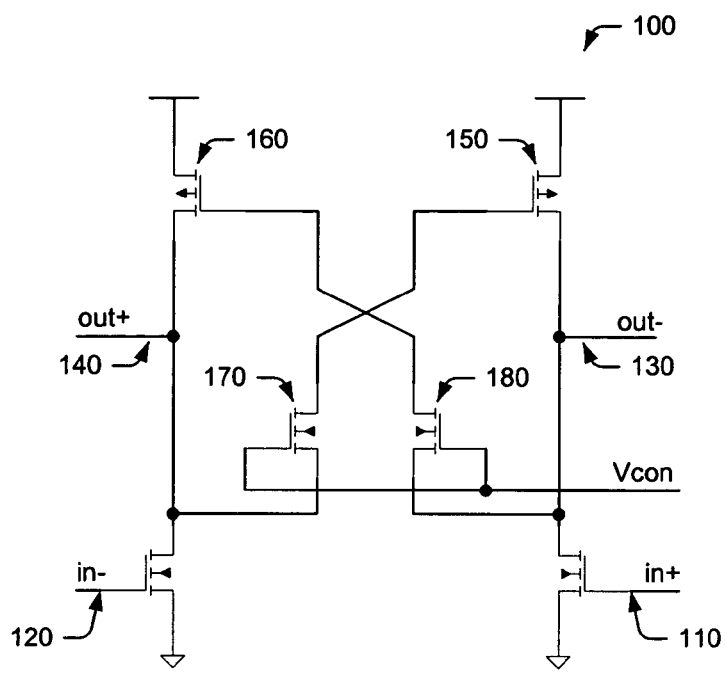
FIG. 1 is a circuit diagram illustrating one embodiment of a differential delay cell with a single-ended control input.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a differential delay cell 100 having differential inputs 110, 120 and differential outputs 130, 140. In addition, delay cell 100 utilizes a pair PMOS load transistors 150, 160 to form a CMOS latch, while using cross-coupled NMOS transistors 170, 180 to control the gate voltage of PMOS transistors 150, 160, respectively. As such, cross-coupled NMOS transistors 170, 180 function to limit the strength of the CMOS latch. This mechanism is used to control the delay of cell 100 by applying a single-ended control voltage ("Vcon") to the gate of cross-coupled transistors 170, 180. The delay time may be reduced, for example, by setting Vcon to a low value, thereby weakening the CMOS latch and increasing the output driving current through the PMOS load. Conversely, the delay time may be increased by setting Vcon to a high value, thereby enabling the CMOS latch to resist voltage switching in differential delay cell 100.

Unfortunately, differential delay cell 100 suffers from several disadvantages. In particular, delay cell 100 applies a single-ended control voltage ("Vcon") to the delay control mechanism. As such, delay cell 100 is not truly differential and, therefore, is not likely to achieve maximum noise reduction in all cases. In addition, the frequency versus control voltage response of delay cell 100 is substantially non-linear over the entire frequency range of operation. A non-linear frequency response may be caused when an increase in the gate-to-source voltage (Vgs) of control transistors 170, 180 causes the amount of current flowing through those transistors (i.e., the drain-to-source current, Ids) to increase exponentially. As a result, delay cell 100 may provide an inconstant gain to a PLL or DLL device, thereby complicating the design of the PLL/DLL.

In other words, the delay provided by delay cell 100 is determined by the average amount of current flowing through control transistors 170 and 180. Since transistors 170 and 180 are both controlled by a single-ended control voltage ("Vcon"), the current flowing through those transistors may differ depending on whether the output signals at nodes 130 and 140 are logic high or low. When the output signals are supplied to an oscillator of a PLL/DLL, the unequal currents may cause a wave shape difference between the top and bottom halves of the oscillator output signal. This may allow low frequency noise to mix and accumulate in the oscillator, which may ultimately vary the oscillation period. To avoid variations in the oscillation period (i.e., oscillator jitter), additional componentry may be added for approximating the average gain of the delay cell output and supplying the average gain, instead of the actual gain, to the oscillator. Unfortunately, the actual bandwidth of the PLL/DLL may vary depending on how far the actual gain deviates from the average gain.

Figure 2:
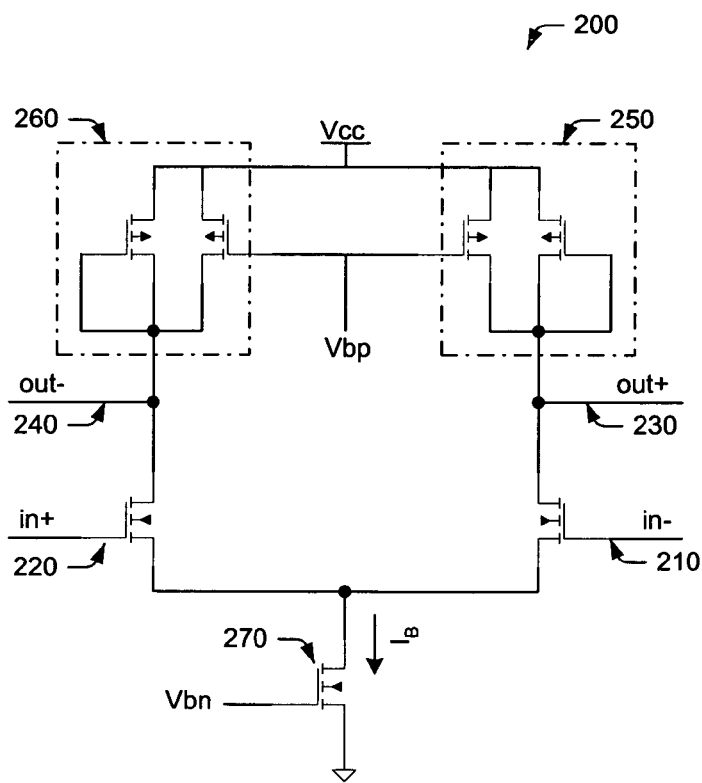
FIG. 2 is a circuit diagram illustrating another embodiment of a differential delay cell with differential symmetric load transistors.

FIG. 2 illustrates a typical differential RC delay cell 200 having differential inputs 210, 220 and differential outputs 230, 240. In addition, delay cell 200 includes a pair of differential resistive load elements 250, 260 called "symmetric loads." Each of the symmetric loads consists of a diode-connected PMOS transistor in shunt with an equally sized biased PMOS transistor. Delay cell 200, however, requires a replica biasing circuit (not shown) to generate the PMOS bias voltage, Vbp, which is input to resistive load elements 250, 260. Such a biasing circuit is often undesirable, as described in more detail below. The delay through delay cell 200 can be modeled by:

$$(Vdd - I \cdot R) + I \cdot R \cdot \left[1 - e^{\left(\frac{-t}{R \cdot C}\right)}\right] = Vdd - (I \cdot R) \cdot \left[1 - e^{\left(\frac{-t}{R \cdot C}\right)}\right],$$

where the right and left sides of the above equation represent the rising edge and falling edge of differential outputs 230 and 240, respectively. Solving for t in the equation results in the expression for delay:

$$t = 1n(2) \cdot R \cdot C.$$

The delay, t, through delay cell 200 is generally modified by changing the bias of the symmetric load transistors (i.e., changing the value of Vbp), while also changing the current bias ($I_B$) levels on the current source 270 to maintain relatively constant voltage levels. Stated another way, the bias voltages Vbp and Vbn may be independently adjusted to change the delay, while maintaining a substantially constant bias current ($I_B$).

However, delay cell 200 may be undesirable for several reasons. As noted above, for example, a replica biasing circuit may be required to generate the bias voltages, Vbp and Vbn. Such a biasing circuit may undesirably increase the power and area consumption of the delay circuit, in addition to increasing manufacturing costs and the possibility for errors. Moreover, since the bias voltages (Vbp and Vbn) provided to delay cell 200 are not truly differential voltages, they may limit the noise rejection capabilities of delay cell 200 similar to the manner in which the capabilities were limited in delay cell 100. In other words, delay cell 200 may also suffer a substantially non-linear frequency versus control voltage response, thereby providing an inconstant gain to a PLL or DLL device and complicating the design of the PLL/DLL.

Figure 3:
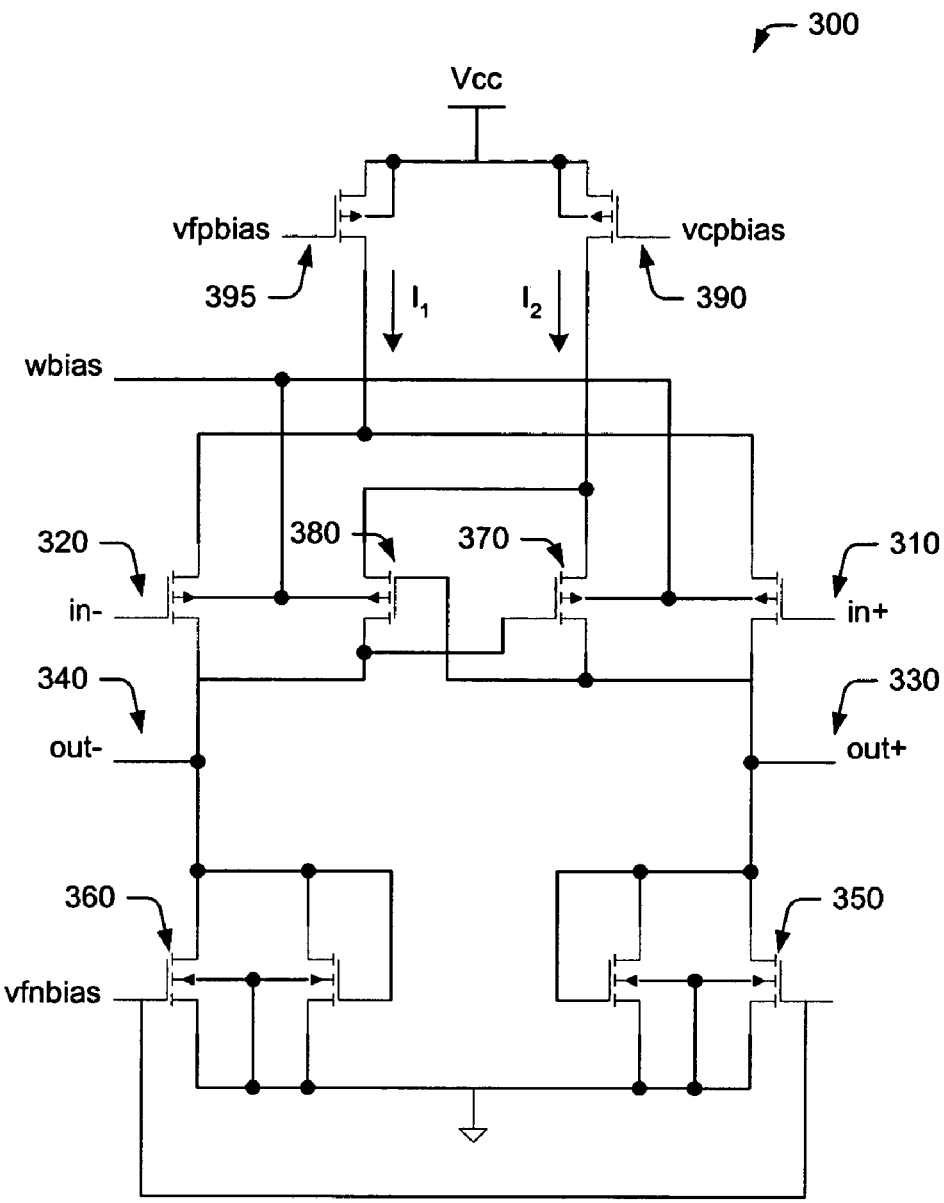
FIG. 3 is a circuit diagram illustrating yet another embodiment of a differential delay cell with positive feedback.

FIG. 3 illustrates a differential delay cell 300 with positive feedback. In this cell, the delay is controlled by altering the final charging value and holding the load resistance constant. Though active or passive loads may be used, the load resistance may be held constant by supplying a constant load voltage (vfnibias) to the gate terminals of loads 350 and 360. However, the load voltage may be adjusted to keep the common mode voltage of output nodes 330 and 340 near (Vcc+Vgnd)/2, and therefore, is not a major contributor to the delay of the delay cell. Instead, two currents, $I_1$ and $I_2$, may be used to control the delay through delay cell 300 by altering the final charging value supplied to output nodes 330 and 340. In the embodiment of FIG. 3, the final charging value is determined by the ratio of currents $I_1/I_2$ and controlled by the independently adjustable voltages (vfpbias and vcpbias) supplied to transistors 395 and 390. In this manner, the propagation delay through cell 300 may be reduced by making $I_1$ larger than $I_2$, and increased by making $I_1$ smaller than $I_2$. However, delay cell 300 may latch if the current ($I_2$) in the positive feedback (i.e., the current supplied to source terminals of cross-coupled transistors 370 and 380) were allowed to become greater than approximately 50% of the total current ($I_1+I_2$) in the delay cell. If delay cell 300 were used to form a voltage-controlled oscillator (VCO), latching of the cell would be undesirable, since it would most likely terminate any VCO oscillations.

Therefore, a need exists for an improved differential delay cell, which overcomes the disadvantages of those described above. The improved delay cell would not only have differential inputs and outputs, but would also be controlled by differential control values, thereby enabling the improved delay cell to be truly differential. A truly differential delay cell would provide superior power supply noise rejection (PSNR) performance. The improved delay cell would also demonstrate a substantially linear frequency versus control current response over some, if not all, of the cell's frequency range of operation. As such, the improved delay cell may be configured to provide a constant gain to a PLL or a DLL device, thereby reducing the complexity of such a device. Moreover, the improvements provided herein may substantially prevent the delay cell from latching (and thus, stopping VCO oscillations) when current in the feedback stage exceeds approximately 50% of the total current in the delay cell. Such a differential delay cell will now be described in reference to FIGS. 4–9.

A differential delay cell in accordance with the present invention generally includes three stages, which are referred to herein as the primary, secondary and feedback stages. The differential delay cell may be constructed using CMOS or BiCMOS technologies, as shown in FIGS. 4 and 7–9. In some cases, the CMOS implementation may be preferred in applications that require relatively low power supply voltages, whereas the BiCMOS implementation may be chosen when relatively high speed or low jitter are desired. With the exception of process technology, however, the differential delay cell of FIG. 7 (i.e., BiCMOS delay cell 700) is substantially identical in both configuration and function to the differential delay cell of FIG. 4 (i.e., CMOS delay cell 400). Thus, even though a CMOS implementation of the differential delay cell is described below with reference to FIG. 4, the same discussion may be equally applied to the delay cell of FIG. 7 (note: similar reference numerals are used to describe both delay cells). In addition, one skilled in the art would easily understand how suitable technologies—other than CMOS or BiCMOS—may be alternatively used to fabricate the presently described differential delay cell.

Figure 4:
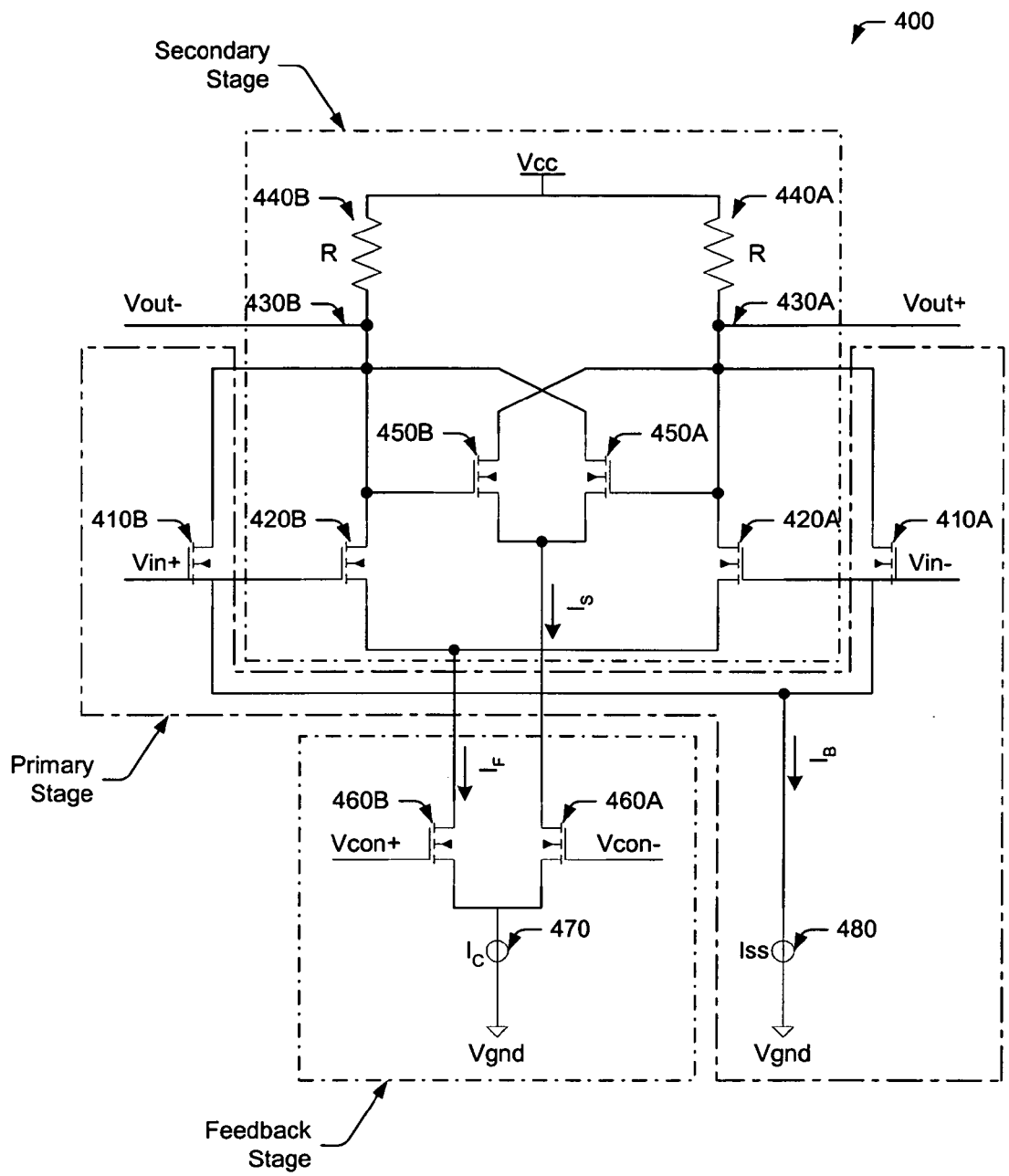
FIG. 4 is a circuit diagram illustrating a preferred embodiment of a differential delay cell using CMOS technology.

Referring to FIG. 4, the primary stage of differential delay cell 400 generally includes differential input transistors 410A, 410B and a constant current source ($I_{SS}$) 480, which is coupled in parallel between the source terminals of input transistors 410A, 410B and ground. As such, the primary stage of delay cell 400 may be adapted to receive a pair of differential inputs ($V_{in+}$ and $V_{in-}$) and to generate a constant current ($I_B$) when input transistors 410A, 410B are conducting.

The secondary stage of delay cell 400 may also receive the differential inputs ($V_{in+}$ and $V_{in-}$) at the gate terminals of differential input transistors 420A, 420B. The secondary stage may include a pair of resistive loads 440A, 440B, which are coupled in series between a power supply voltage ($V_{cc}$) and the drain terminals of input transistors 420A, 420B. The resistive loads (R) may be fixed or active loads, as desired. A pair of cross-coupled NMOS transistors 450A, 450B may also be included having drain and gate terminals tied to opposing differential outputs ($V_{out+}$ and $V_{out-}$). As shown in FIG. 4, for example, the gate terminal of transistor 450A may be coupled to differential output 430A, while its drain terminal is coupled to differential output 430B. The opposite would be true for transistor 450B.

The source terminals of transistors 450A, 450B may be coupled to control current source ($I_c$) 470 through NMOS transistor 460A. As such, delay cell 400 may be configured to generate a positive feedback current (labeled "$I_S$" for slow current) at times when transistor 460A is conducting. Likewise, the source terminals of differential input transistors 420A, 420B may be coupled to control current source 470 through NMOS transistor 460B. As such, the delay cell may be configured to generate a negative feedback current (labeled "$I_F$" for fast current) at times when transistor 460B is conducting. In this manner, NMOS transistors 460A, 460B may be considered a differential voltage to current converter, and are included along with current source 470 in the feedback stage of the delay cell.

Unlike conventional differential delay cells, however, delay cell 400 is configured to receive a pair of differential control inputs ($V_{con+/-}$) for differentially controlling the amount of delay through delay cell 400. In some cases, the differential control inputs ($V_{con+/-}$) may be generated by a differential charge pump of a PLL or DLL; however, alternative power sources are also possible. The approximate delay through differential delay cell 400 (neglecting, e.g., deep sub-micron transistor effects and only considering the RC charging) can be modeled as follows:

$$\begin{matrix}[V_{dd}-(I_B+I_F+I_S)\cdot R]+\\(I_B+I_F)\cdot R\cdot\left[1-e^{\left(\frac{-t}{R\cdot C}\right)}\right]\end{matrix}=V_{dd}-(I_B+I_F)\cdot R\cdot\left[1-e^{\left(\frac{-t}{R\cdot C}\right)}\right],$$

where the right and left sides of the equation represent the rising and falling edges of differential outputs 430A and 430B, respectively. Solving for t in the equation results in the expression for delay:

$$t=-\ln\left[\frac{1}{2}\cdot\frac{(I_B+I_F-I_S)}{(I_B+I_F)}\right]\cdot R\cdot C.$$

The delay, t, through delay cell 400 may be modified by changing the differential control inputs ($V_{con+/-}$) at the gate terminals of delay control transistors 460A, 460B.

The $V_{con+/-}$ inputs to delay cell 400 may be considered true differential inputs, which are used to control the magnitude of either the positive ($I_S$) or the negative ($I_F$) feedback current. In other words, the secondary and feedback stages of delay cell 400 are configured to share the delay cell control current ($I_c$) in a truly differential manner (note: the sum of $I_F$ and $I_S$ may be substantially equal to $I_c$). As one feedback current increases the other decreases in a proportional amount. For example, as the positive feedback current ($I_S$) approaches zero and the negative feedback current ($I_F$) approaches $I_c$, the voltage threshold of the cell approaches 50% of the total voltage swing (i.e., $V_{swing}/2$). In such a case, the delay through delay cell 400 may approach that of a typical RC delay cell (e.g., approximately RC in practical applications). As the positive feedback current ($I_S$) is increased and the negative feedback current ($I_F$) is decreased, however, the voltage threshold may increase to a point somewhere greater than 50%, thereby increasing the delay to a value substantially greater than RC (e.g., up to approximately 4*RC).

As mentioned above and shown in FIG. 4, the primary stage of delay cell 400 includes a constant bias current, $I_B$, which is independent from the delay control currents ($I_F$ and $I_S$) in the feedback stage. The delay through delay cell 400 may be determined by the ratio of the positive feedback current to the sum of the negative feedback current and the constant bias current, or $I_S/(I_F+I_B)$. In this manner, latching of the delay cell is substantially prevented by using a separate, constant bias current, $I_B$, which is greater than or equal to the control current, $I_C$ (assuming, e.g., infinite transconductance, gm, in ideal transistors). In the case where gm is finite (in realistic transistors), however, the bias current, $I_B$, can be less than the control current, $I_C$, which could potentially allow for the positive feedback current, $I_S$, to be greater than the bias current, $I_B$, without latching the delay cell. In any case, the addition of a separate, constant bias current ($I_B$) within delay cell 400 substantially eliminates the possibility of latching the delay cell and accidentally terminating VCO oscillations.

Figure 5:
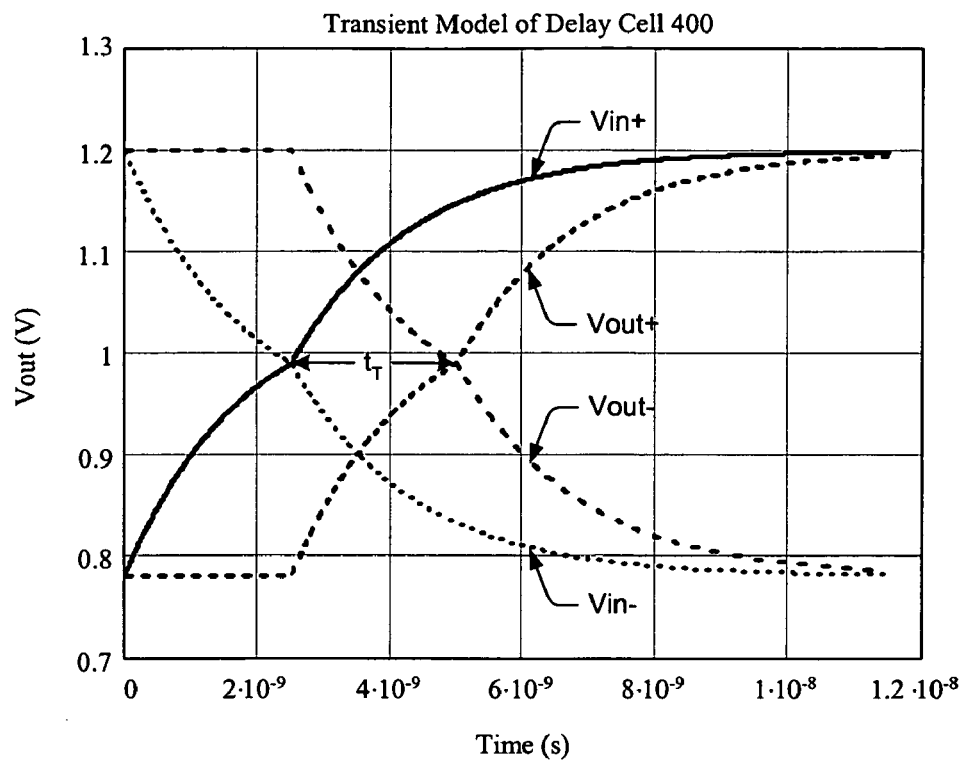
FIG. 5 is a graph illustrating timing characteristics of the differential delay cell of FIG. 4.
Figure 6:
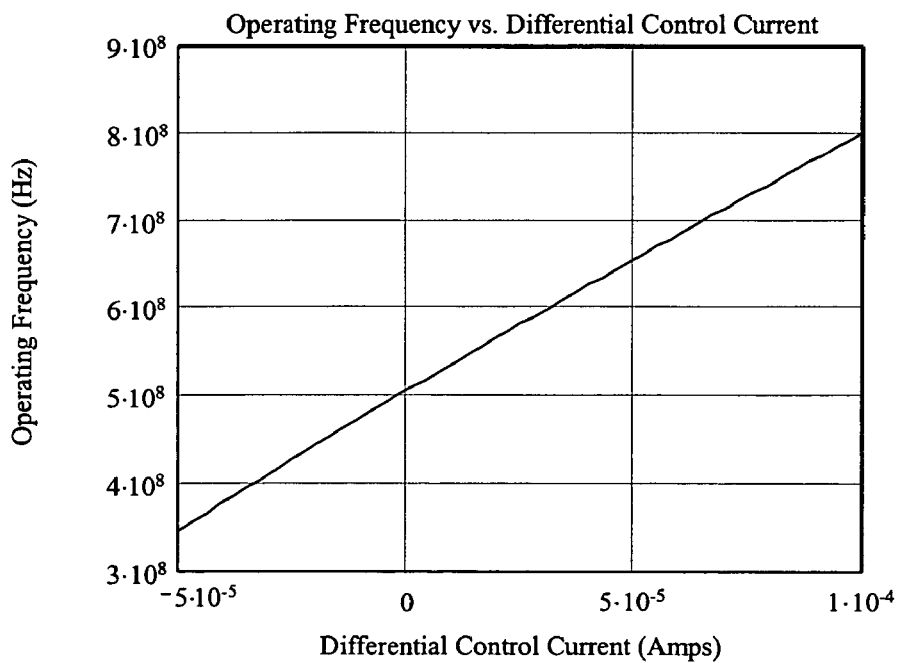
FIG. 6 is a graph illustrating an operating frequency versus differential control current response characteristic of the differential delay cell of FIG. 4.
Figure 7:
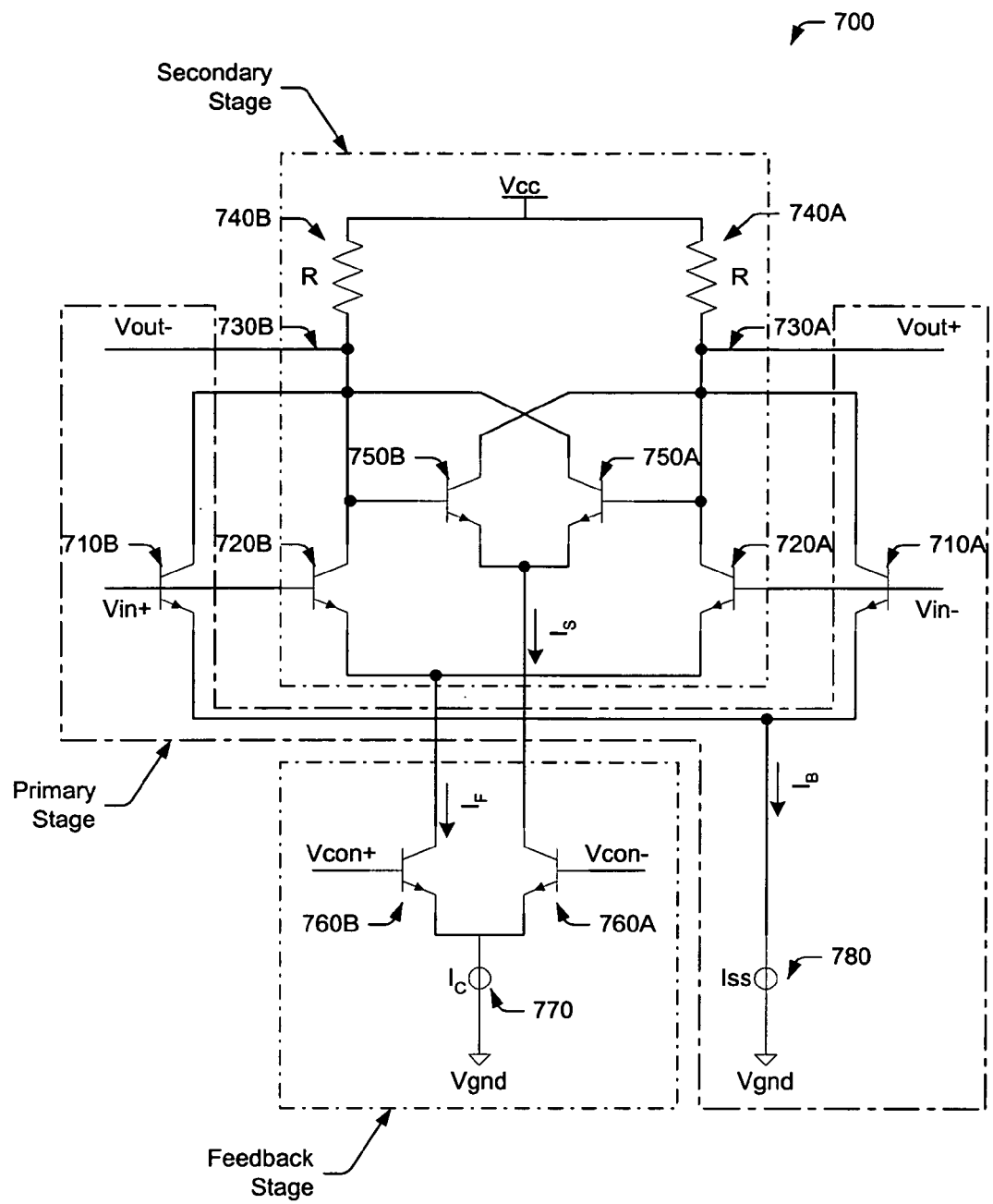
FIG. 7 is a circuit diagram using BiCMOS technology to construct the differential delay cell shown in FIG. 4.

An ideal transient model result for the delay cell of FIG. 4 is shown in FIG. 5, where the total delay through the cell ($t_T$) is the difference in time between the cross points on the graph. In other words, the total delay is measured between the cross point of the differential inputs ($V_{in+}$ and $V_{in-}$) and the cross point of the differential outputs ($V_{out+}$ and $V_{out-}$). As shown in FIG. 5, delay cell 400 provides relatively low jitter and total time delay (which enables the delay cell to be operated at substantially higher frequencies). FIG. 6, on the other hand, shows the substantially linear frequency vs. differential control current response provided by delay cell 400. Unlike the delay cells of FIGS. 1–3, delay cell 400 may be used to provide a constant gain to a PLL or DLL device, thereby reducing the complexity of the PLL/DLL design.

Figure 8:
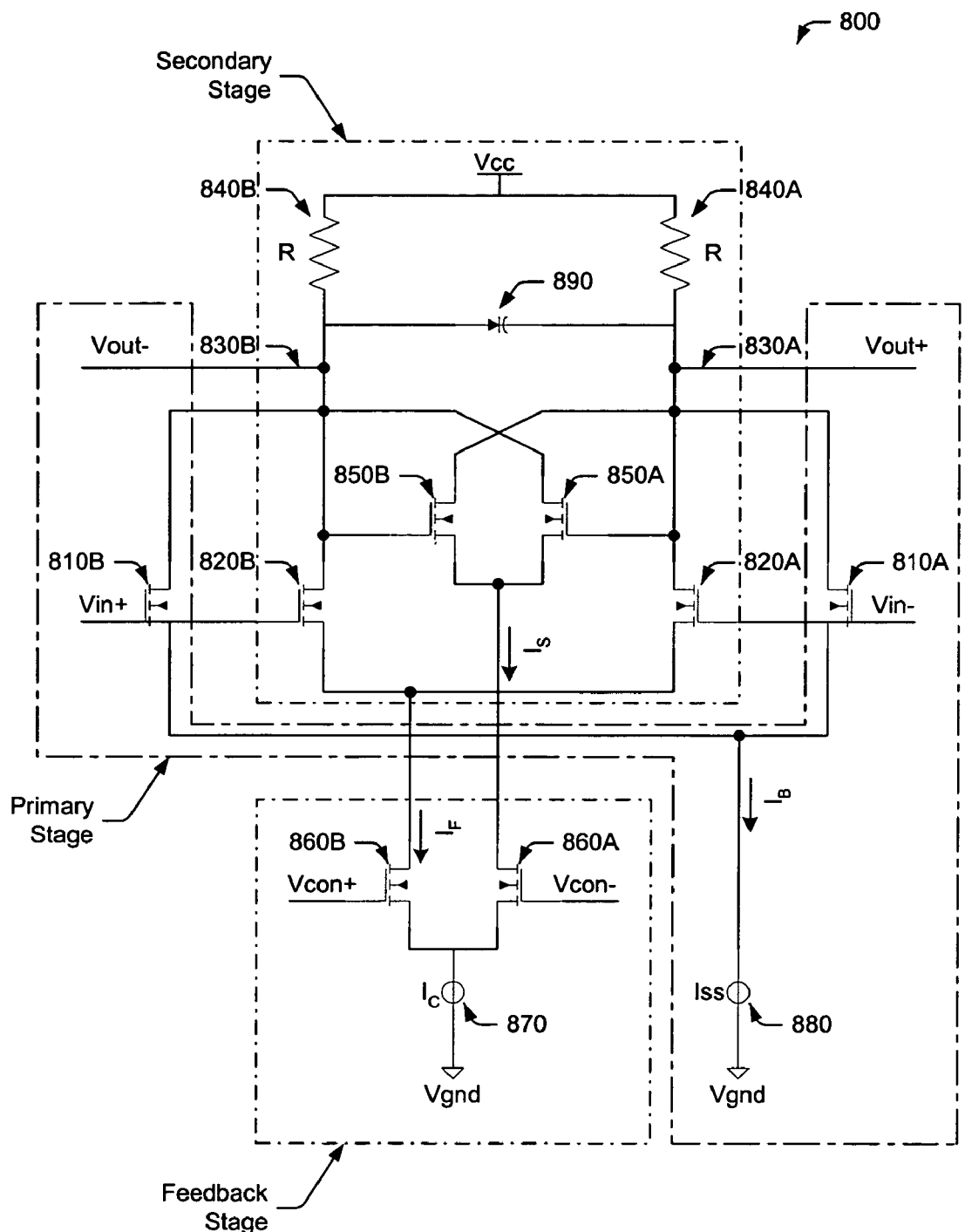
FIG. 8 is a circuit diagram illustrating the addition of a varactor between outputs of the differential delay cell of FIG. 4.

In another embodiment, FIG. 8 illustrates the case in which a variable capacitance element (i.e., a varactor) is included within the delay cell of FIG. 4. As before, similar reference numerals are used to describe similar elements within differential delay cells 400 and 800. As shown in FIG. 8, varactor 890 is coupled in parallel between the resistive loads 840A, 840B of differential delay cell 800. As such, the combination of varactor 890 and resistive loads 840A, 840B may be used to provide additional delay range above the range normally provided by the differential control inputs ($V_{con+/-}$) and resistive loads 840A, 840B alone. In some cases, varactor 890 may increase the delay range by a factor of 3 (or more), and may be useful in applications that desire a substantially wider frequency range with low jitter.

Figures 9A, 9B:
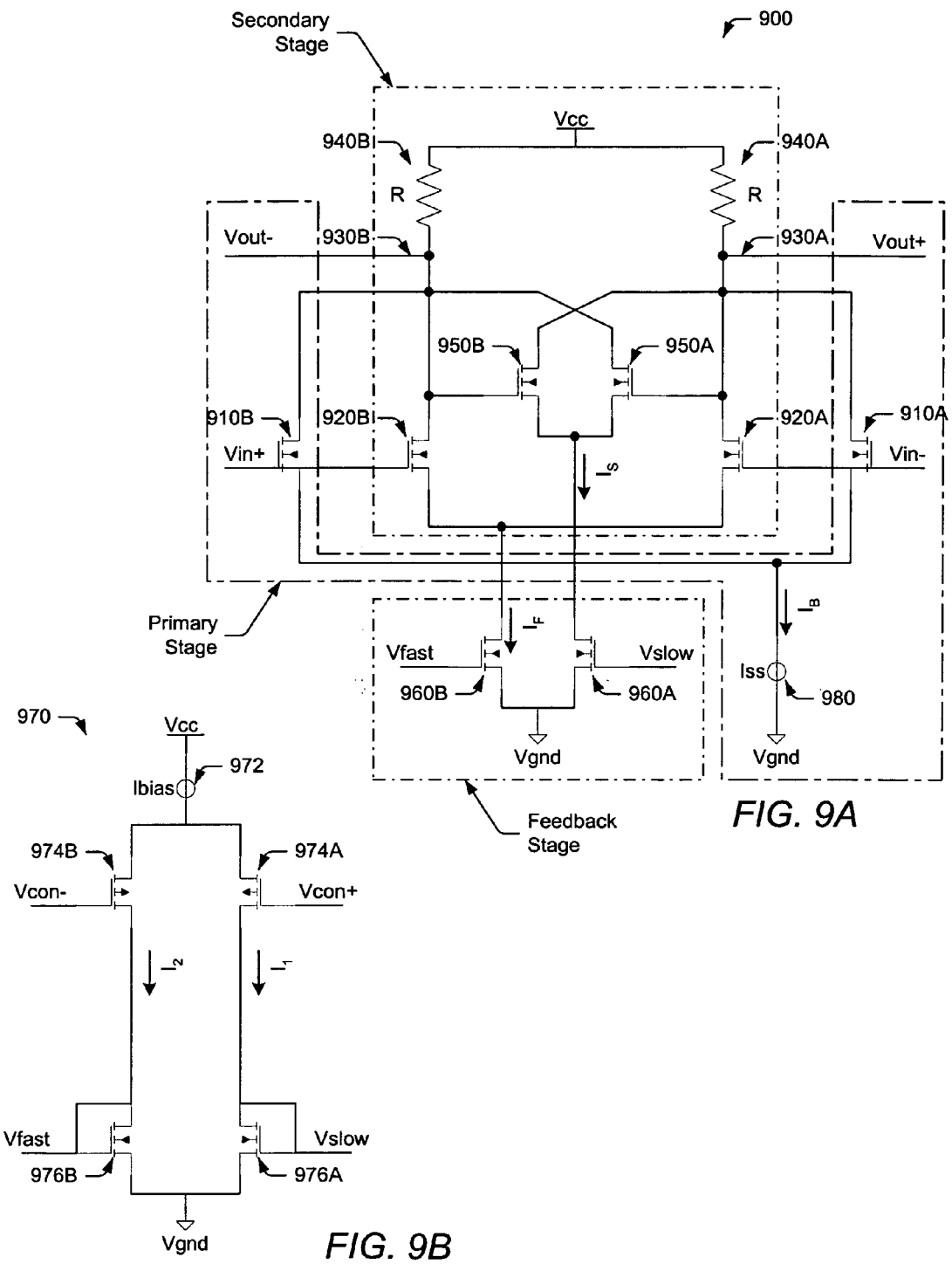
FIG. 9A is a circuit diagram illustrating another preferred embodiment of a differential delay cell using CMOS technology.
FIG. 9B is a circuit diagram, which replaces the control current source in the differential delay cell of FIG. 4 with an alternative control circuit in the differential delay cell of FIG. 9A.

In yet another embodiment, FIG. 9A illustrates changes that may be made to the delay cell of FIG. 4 in the case that a relatively low power supply voltage ($V_{CC}$) is provided to the delay cell. In other words, the arrangement shown in FIG. 9B may be used when the power supply voltage does not allow the differential control circuit (i.e., the feedback stage of delay cell 400) to be placed in series with the delay cell circuitry. As before, similar reference numerals are used to describe similar elements within differential delay cells 400 and 900. As shown in FIGS. 4 and 9A, control current source 470 of delay cell 400 is replaced with differential control circuit 970 in delay cell 900. As described in more detail below, however, the operation of differential control circuit 970 is substantially identical to the operation of the differential control circuit of FIG. 4.

As shown in FIG. 9B, differential control circuit 970 includes a pair of PMOS transistors 974A and 974B, which are coupled in parallel between a bias current source ($I_{bias}$) 972 and ground. Differential control voltages $V_{con+}$ and $V_{con-}$ are used to drive the gate nodes of PMOS transistors 974A and 974B, respectively. In this manner, PMOS transistors 974A and 974B form a differential voltage to current converter, similar to NMOS transistors 460A and 460B of delay cell 400. As shown in FIG. 9B, PMOS transistors 974A and 974B may generate two currents ($I_1$ and $I_2$) that are substantially proportional to the voltage difference between $V_{con+}$ and $V_{con-}$. Currents $I_1$ and $I_2$ are used to drive a pair of diode-connected NMOS transistors 976A and 976B to produce voltages $V_{fast}$ and $V_{slow}$, which may then be used as inputs to NMOS transistors 960A and 960B of delay cell 900 of FIG. 9A. In this manner, substantially identical currents (e.g., $I_F \approx I_2$ and $I_S \approx I_1$) may be generated when the voltages $V_{fast}$ and $V_{slow}$ are applied to the respective gates of NMOS transistors 960A and 960B. However, the minimum power supply voltage needed for operating delay cell 900 is reduced by not placing the differential control circuit (970) supplying the control currents ($I_1$ and $I_2$) in series with the delay cell.

The differential delay circuit, as described herein with reference to FIGS. 4–9, provides several advantages over the conventional delay cells shown in FIGS. 1–3. In one example, the differential delay cell of the present invention is truly differential, having not only differential inputs/outputs, but also differential control inputs. Thus, the present differential delay cell provides improved noise rejection performance, as compared to conventional delay cells, and may be used in PLL/DLL designs as part of a low noise VCO or delay line. The superior noise rejection performance of the delay cell may also lead to improved frequency stability around the center frequency.

In addition, and as shown in FIG. 6, the differential delay cell described herein has a very linear frequency vs. control current, and thus a very constant gain, over the entire frequency range of operation. As a result, the design of a PLL/DLL may be simplified since the bandwidth of these devices is directly dependent on the gain of the delay cells included within the VCO or delay line. Due to the addition of a separate, constant bias current, the delay cell is substantially prevented from latching (and thus, stopping VCO oscillations) when current in the feedback stage exceeds approximately 50% of the total current in the delay cell.

Furthermore, the differential delay cell can be used with fixed loads or active loads in conjunction with a varactor for additional tuning range capability, as described in the embodiment of FIG. 8. Moreover, the differential delay cell may be used in circuits that require relatively low power supply voltages (e.g., circuits fabricated using deep submicron technologies), as described in the embodiment of FIG. 9. In short, the differential delay cell provided herein improves upon conventional delay cells by providing low noise, true differential control, linear current control, and high frequency stability around the center frequency.

Figure 10:
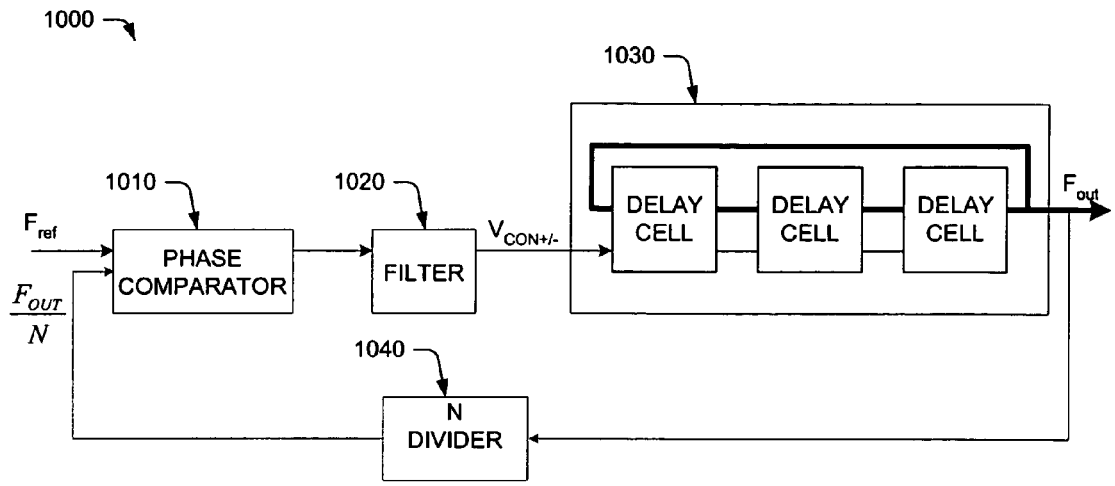
FIG. 10 is a block diagram illustrating an exemplary phase-locked loop circuit including one or more of the preferred differential delay cells coupled to form a ring oscillator.

FIG. 10 illustrates a phase-locked loop 1000 including a phase comparator 1010, a loop filter 1020, a voltage controlled oscillator (VCO) 1030 and a frequency divider 1040. Phase comparator 1010 compares the phase of the feedback signal ($F_{OUT}/N$) to the reference signal ($F_{REF}$) and generates an error signal, or phase correction signal. In some cases, phase comparator 1010 may include a phase frequency detector and a charge pump; however, a voltage pump may alternatively be used. Loop filter 1020 filters the error signal generated by phase comparator 1010. Frequency divider 1040 divides the frequency of one of the VCO output signals ($F_{OUT}$) to produce the feedback signal ($F_{OUT}/N$). In the embodiments that include frequency divider 1040, PLL 1000 functions as a frequency multiplier. However, frequency divider may not be included in some embodiments, such that the VCO output signal is fed back to phase comparator 1010.

VCO 1030 includes a number of differential delay cells (e.g., any of delay cells 400, 700, 800 or 900) coupled in a ring configuration. Though three delay cells are illustrated in the embodiment of FIG. 10, any number of delay cells may alternatively be used. An odd number is shown because an odd number of inversions are used to make the ring oscillate. However, an even number of delay cells may alternatively be used to generate a desired free-running frequency, with some delay cells implementing buffers and some delay cells implementing inverters. Each differential delay cell within VCO 1030 has differential outputs connected to the differential inputs of a subsequent differential delay cell. Likewise, each differential delay cell has differential inputs coupled to the differential outputs of a previous differential delay cell. An inverter is formed if the polarity of the differential outputs is different from the polarity of the inputs. Conversely, a buffer is formed if the polarity of the differential outputs is similar to the polarity of the inputs.

In the embodiment of FIG. 10, each of the differential delay cells within VCO 1030 is coupled to receive a differential control input ($V_{con+/-}$) from a differential charge pump and loop filter. In some embodiments, however, a differential driver (not shown) may be included within VCO 1030 for producing a differential control input from a single-ended control input. Changing the voltages supplied to the differential control inputs functions to modify the delay through the differential delay cells and adjust the frequencies output from the VCO. As noted above, the differential delay cells demonstrate a substantially linear frequency vs. control current over the entire frequency range of operation. As a result, the design of PLL 1000 may be simplified, due to the constant gain generated by VCO 1030, by avoiding the need to approximate an average gain of the delay cell output.

Figure 11:
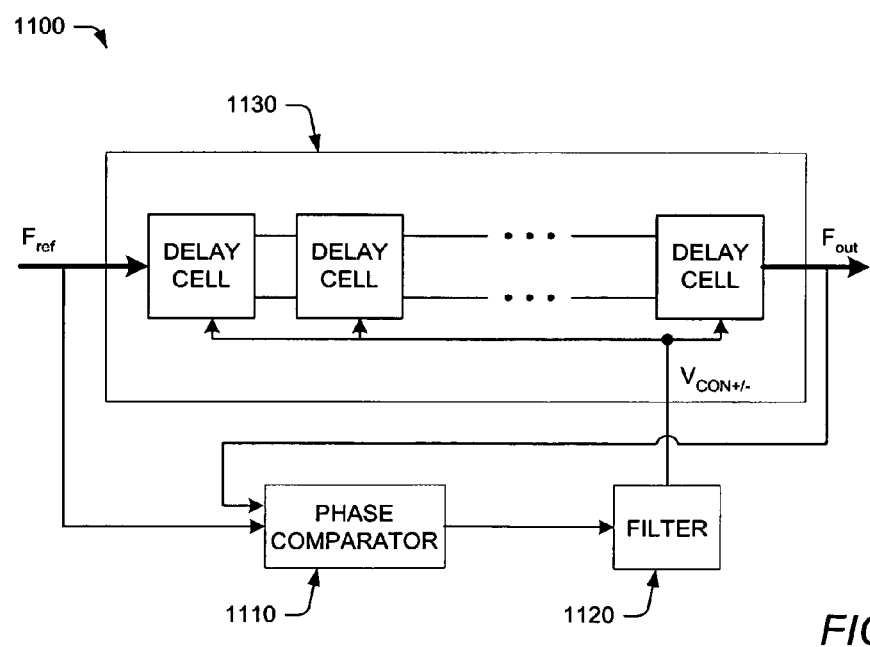
FIG. 11 is a block diagram illustrating an exemplary delay-locked loop circuit including one or more of the preferred differential delay cells coupled to form a delay line.

FIG. 11 illustrates a delay-locked loop 1100 including phase comparator 1110, loop filter 1120 and delay line 1130. Phase comparator 1110 compares the phase of the feedback signal ($F_{OUT}$) to the phase of the reference signal ($F_{REF}$) and generates an error signal, or phase correction signal. Loop filter 1120 filters the error signal and adjusts the delay of the delay line 1130 by supplying a differential control input ($V_{con+/-}$) to delay line 1130. The combined actions of phase comparator 1110 and filter 1120 cause delay line 1130 to produce a delay, which is substantially equal to an integer number of the reference periods.

Delay line 1130 may include any number of differential delay cells in accordance with the present invention (e.g., any number of delay cells 400, 700, 800 or 900). Generally speaking, delay line 1130 receives an input signal ($F_{REF}$) and outputs a delayed version of the input signal ($F_{OUT}$). In the embodiment of FIG. 11, delay line 1130 receives a differential input signal and a differential control signal for producing a differential output signal. The differential control signal ($V_{con+/-}$) provided to delay line 1130 may be produced by a differential control pump and loop filter. In an alternative embodiment, however, delay line 1130 may include a differential driver (not shown) for producing a differential control signal from a single-ended control signal.

It will be appreciated to those skilled in the art having the benefit of this disclosure that this invention is believed to provide a differential delay cell, which overcomes the disadvantages of conventional delay cells. Further modifications and alternative embodiments of various aspects of the invention will be apparent to those skilled in the art in view of this description. For example, the differential delay cell described herein may be utilized in substantially any other device (besides PLL/DLLs) that benefits from accurate analog delays. It is intended, therefore, that the following claims be interpreted to embrace all such modifications and changes and, accordingly, the specification and drawings are to be regarded in an illustrative rather than a restrictive sense.

What is claimed is:

1. A differential delay cell configured to receive a pair of differential input values and a pair of differential control values and to produce a pair of differential output values, the differential delay cell comprising:
   a first pair of differential input transistors, each coupled for receiving one of the pair of differential input values at a gate terminal thereof;
   a pair of cross-coupled transistors, each coupled for receiving one of the pair of differential output values at a gate terminal, and another of the pair of differential output values at a drain terminal, thereof;
   a pair of resistive loads, each coupled between a power supply node and a drain terminal of a different one of the first pair of differential input transistors; and
   an adjustable load coupled in parallel between the drain terminals of the first pair of differential input transistors.

2. The differential delay cell as recited in claim 1, further comprising a pair of differential control transistors, each coupled for receiving one of the pair of differential control values.

3. The differential delay cell as recited in claim 2, wherein one of the differential control transistors is coupled to the first pair of differential input transistors for conducting a first control current, while the other of the differential control transistors is coupled to the pair of cross-coupled transistors for conducting a second control current.

4. The differential delay cell as recited in claim 3, wherein the pair of differential control transistors are configured for ensuring, that as one of the control currents increases, the other of the control currents decreases by a substantially identical amount.

5. A differential delay cell, comprising:
   a first pair of differential input transistors having source terminals, which are coupled together and to a first constant current source through a first one of a pair of differential control transistors;
   a pair of cross-coupled transistors having source terminals, which are coupled together and to the first constant current source through a second one of the pair of differential control transistors; and
   a second pair of differential input transistors having:(i) source terminals, which are coupled together and to a second constant current source, (ii) drain terminals, which are coupled to drain terminals of the first pair of differential input transistors and drain terminals of the pair of cross-coupled transistors, and (iii) gate terminals, each coupled to a different gate terminal of the first pair of differential input transistors for receiving a different one of a pair of differential input signals.

6. The differential delay cell as recited in claim 5, wherein the first one of the differential control transistors is coupled for receiving a first control current from the first pair of differential input transistors, and wherein the second one of the differential control transistors is coupled for receiving a second control current from the pair of cross-coupled transistors.

7. The differential delay cell as recited in claim 6, wherein the pair of differential control transistors are coupled for receiving differential control values configured for increasing one of the control currents, while decreasing the other of the control currents by a substantially identical amount.

8. The differential delay cell as recited in claim 7, wherein the pair of differential control transistors enable the differential delay cell to provide a substantially constant gain and a substantially linear frequency versus control current response over an operational range of the differential delay cell.

9. The differential delay cell as recited in claim 5, wherein the second constant current source is adapted to prevent the differential delay cell from latching when a control current associated with the first constant current source becomes greater than approximately 50% of a total current within the differential delay cell.

10. The differential delay cell as recited in claim 5, further comprising a pair of resistive loads and an adjustable load, wherein each of the resistive loads are coupled between a power supply node and the drain terminal of a different one of the second pair of input transistors, and wherein the adjustable load is coupled in parallel between the drain terminals of the second pair of input transistors.

11. The differential delay cell as recited in claim 10, wherein the adjustable load is adapted to extend a range by which an output signal produced by the differential delay cell can be delayed relative to an input signal applied to the differential delay cell.

12. The differential delay cell as recited in claim 4, farther comprising a constant current source coupled between source terminals of the pair of differential control transistors and ground for generating the first and second control currents conducted through the pair of differential control transistors.

13. The differential delay cell as recited in claim 4, further comprising a differential control circuit configured for generating the pair of differential control values supplied to the pair of differential control transistors, wherein the differential control circuit comprises:

a pair of p-channel transistors coupled for receiving a pair of differential control voltages and for generating a pair of currents in response thereto; and a pair of diode-connected n-channel transistors coupled for receiving the pair of currents and for generating the pair of differential control values in response thereto.

14. The differential delay cell as recited in claim 13, wherein the differential control circuit further comprises a bias current source coupled between a power supply node and source terminals of the pair of p-channel transistors.

15. The differential delay cell as recited in claim 1, further comprising a second pair of differential input transistors, each coupled for receiving a different one of the pair of differential input values at a gate terminal thereof.

16. The differential delay cell as recited in claim 15, wherein drain terminals of the second pair of differential input transistors are coupled to the drain terminals of the first pair of differential input transistors, and wherein source terminals of the second pair of differential input transistors are coupled together and to a constant current source.

* * * * *

UNITED STATES PATENT AND TRADEMARK OFFICE
CERTIFICATE OF CORRECTION

| | | |
|---|---|---|
| PATENT NO. | : 7,176,737 B2 | Page 1 of 1 |
| APPLICATION NO. | : 10/876730 | |
| DATED | : February 13, 2007 | |
| INVENTOR(S) | : Baker et al. | |

It is certified that error appears in the above-identified patent and that said Letters Patent is hereby corrected as shown below:

Col. 14, line 1: delete "farther" and substitute --further--.

Signed and Sealed this

First Day of May, 2007

JON W. DUDAS
*Director of the United States Patent and Trademark Office*